(12) United States Patent
Tajima

(10) Patent No.: US 6,396,557 B1
(45) Date of Patent: May 28, 2002

(54) TAPE CARRIER PACKAGE AND LIQUID CRYSTAL DISPLAY DEVICE

(75) Inventor: Naoyuki Tajima, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/651,570

(22) Filed: Aug. 28, 2000

Related U.S. Application Data

(62) Division of application No. 08/847,808, filed on Apr. 25, 1997, now Pat. No. 6,133,978.

(30) Foreign Application Priority Data

Apr. 26, 1996 (JP) .............................................. 8-108288

(51) Int. Cl.⁷ .......................... G02F 1/133; H01L 25/00
(52) U.S. Cl. ..................................... 349/150; 257/676
(58) Field of Search ................................ 349/149, 150, 349/151, 152; 257/668, 676, 673, 702, 753; 361/749, 750, 761, 764, 767; 345/205

(56) References Cited

U.S. PATENT DOCUMENTS

| | | | | |
|---|---|---|---|---|
| 5,477,080 A | * | 12/1995 | Ishisaka et al. | ............. 257/668 |
| 5,478,006 A | | 12/1995 | Taguchi | |
| 6,104,464 A | * | 8/2000 | Adachi et al. | ............. 349/150 |
| 6,128,063 A | * | 10/2000 | Uchiyama et al. | .......... 349/150 |

FOREIGN PATENT DOCUMENTS

| | | |
|---|---|---|
| JP | 2-132418 | 5/1990 |
| JP | 4-71246 | 3/1992 |
| JP | 4-76929 | 3/1992 |
| JP | 4-105331 | 4/1992 |
| JP | 4-77134 | 7/1992 |
| JP | 4-317347 | 11/1992 |
| JP | 863272 | 12/1992 |
| JP | 4-359456 A | 12/1992 |
| JP | 5-297394 | 11/1993 |

OTHER PUBLICATIONS

Patent Abstracts of Japan, vol. 011, No. 227 (E–526) Jul 23, 1987 & JP 62 04138A (Seiko Instr & Electronics Ltd), Feb. 24, 1987.
Patent Abstracts of Japan, vol. 010, No. 374 (P–527), Dec. 12, 1986 & JP 61 167924 A (Matsushita Electric Ind Co Ltd), Jul 29, 1986.

* cited by examiner

*Primary Examiner*—William L. Sikes
*Assistant Examiner*—Tai V. Duong
(74) *Attorney, Agent, or Firm*—Nixon & Vanderhye P.C.

(57) ABSTRACT

A tape carrier package comprising a tape carrier, a semiconductor chip, and an anisotropic conductive resin. The tape carrier includes an insulating film having a through-hole, a conductor pattern formed on the insulating film including leads projecting into the through-hole, and inner wiring electrically connected to a part of the conductor pattern. The semiconductor chip is provided in the through-hole and has connecting bumps electrically connected to end portions of the leads. The anisotropic conductive resin are provided so as to cover at least a portion of the semiconductor chip including a junction of the connecting bumps and the end portions of the leads.

5 Claims, 14 Drawing Sheets

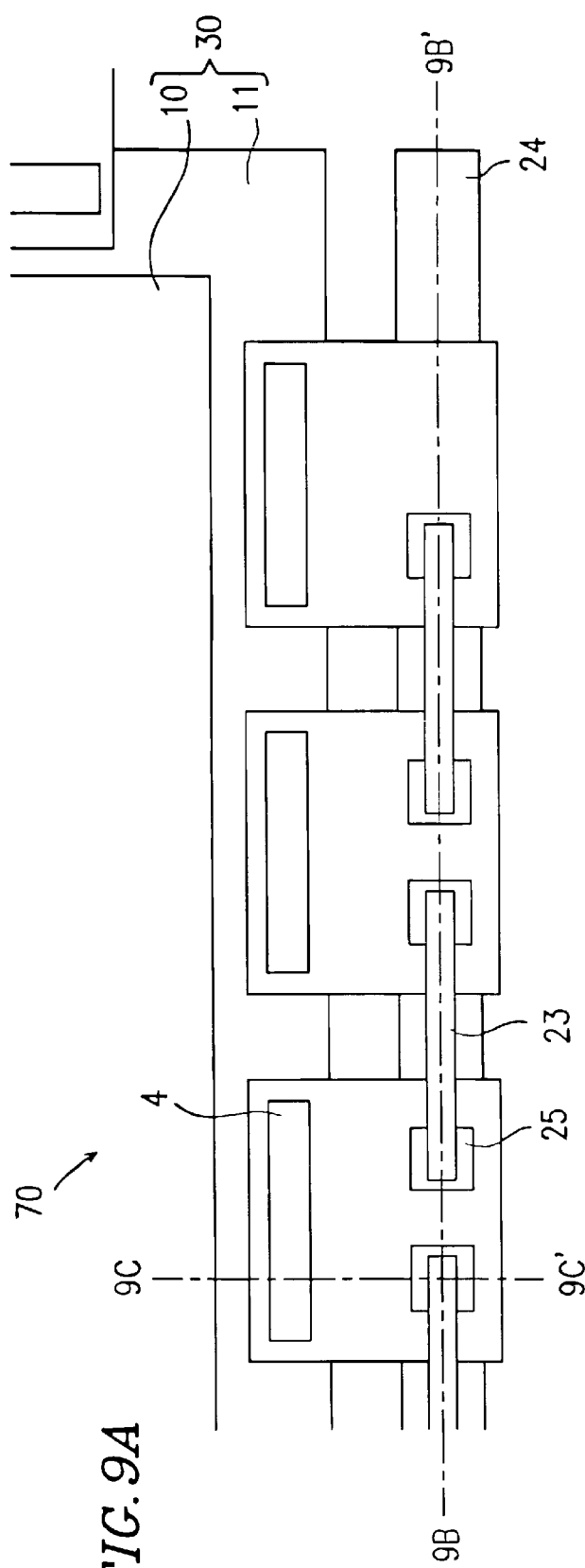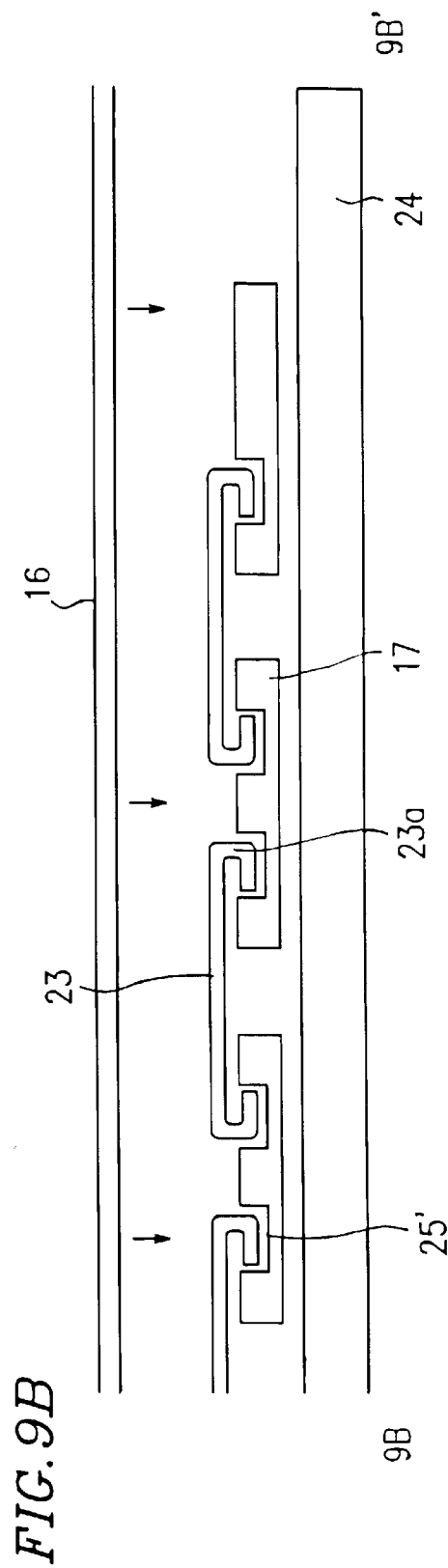
FIG.9A
FIG.9B

US 6,396,557 B1

TAPE CARRIER PACKAGE AND LIQUID CRYSTAL DISPLAY DEVICE

This is a divisional of application Ser. No. 08/847,808, filed Apr. 25, 1997, now U.S. Pat. No. 6,133,978 the entire content of which is hereby incorporated by reference in this application.

BACKGROUND OF THE INVENTION

1. Field of the Invention

The present invention relates to a tape carrier package which is attached to the periphery of a liquid crystal panel of a liquid crystal display device and accommodates a semiconductor chip for driving the liquid crystal panel on a tape carrier, and a liquid crystal display device provided with tape carrier packages.

2. Description of the Related Art

Conventional liquid crystal display devices, as shown in FIG. 10, have been known. This liquid crystal display device 150 is mainly composed of a liquid crystal panel 100, a plurality of tape carrier packages (TCPs) 117, and a common printed wiring board 118. The liquid crystal panel 100 is mainly composed of an upper glass substrate 110, a lower glass substrate 111, and a liquid crystal layer (not shown) interposed therebetween. Reference numeral 122 denotes a flexible substrate.

In this liquid crystal display device, as shown in FIG. 13, the semiconductor chips 104 for driving the liquid crystal are mounted onto the liquid crystal panel 100 as follows: a tape carrier with semiconductor chips 104 placed thereon is cut to a predetermined size to obtain TCPs 117; each TCP 117 is supplied onto the liquid crystal panel 100; and a conductive pattern portion (e.g., outer leads) of each TCP 117 and electrodes on the lower glass substrate 111 of the liquid crystal panel 100 are crimped onto each other by heating with an anisotropic conductive film 140 interposed therebetween, whereby each TCP 117 is mounted onto the liquid crystal panel 100.

As shown in FIG. 13, outer leads (not shown) of the TCPs 117 are connected to wiring (not shown) of the printed wiring board 118. A signal for driving the liquid crystal is supplied to each semiconductor chip 104 through each TCP 117 from the printed wiring board 118. The printed wiring board 118 also has a region 118a for accommodating components, such as a chip capacitor, which cannot be incorporated into the circuit of each semiconductor chip 104.

FIG. 11 is a cross-sectional view of another liquid crystal display device 160 with a TCP 117' attached to the periphery of a liquid crystal panel 100. The TCP 117' is attached to the liquid crystal panel 100 as follows: an output terminal 117a of the TCP 117' for driving the liquid crystal is connected to the liquid crystal panel 100 via an anisotropic conductive film 140; thereafter, an input signal terminal 117b of the TCP 117' is connected to a printed wiring board 118 by soldering or via an anisotropic conductive film 140'; and the TCP 117' is bent along the contour of a module, whereby the attachment of the TCP 117' to the liquid crystal panel 100 is complete. In FIG. 11, reference numeral 119 denotes a backlight unit; 120 denotes a polarizing plate; and 116 denotes a bezel.

It is also known that a semiconductor chip is attached to a liquid crystal panel by a Chip-On-Glass (COG) method. According to the COG method, as shown in FIG. 12, a semiconductor chip 104 having metal bumps 104a is directly connected to wiring (not shown) on a lower glass substrate 111 by face down bonding. Regarding the COG method, the following two processes are known.

Firstly, a semiconductor chip having solder bumps is directly attached to a glass substrate of a liquid crystal panel, and then, a gap between the semiconductor chip and the glass substrate is filled with a resin (Japanese Laid-Open Patent Publication No. 4-105331). Secondly, a semiconductor chip having gold bumps is connected to wiring on a glass substrate of a liquid crystal panel via an anisotropic conductive film 121 (Japanese Laid-Open Patent Publication Nos. 4-76929, 4-71246, and 4-317347). In the case of the second process, a gap between the semiconductor chip and the glass substrate is filled with a resin (binder) of the anisotropic conductive film. According to the second process, repairs are easily conducted, and it is not required to fill a resin in the gap between the semiconductor chip and the glass substrate; therefore, this process has been mainly used.

In recent years, there is a tendency to secure a larger display area with the same module size by decreasing the width of the portion of a liquid crystal display device that extends off a glass substrate. Furthermore, there is a great demand for a reduction in costs for liquid crystal panels in light of the generally, higher production costs compared with those of CRTs (Cathode Ray Tube).

Under such circumstances, in order to decrease the width of a TCP which extends off a glass substrate, the following two methods using TCPs have been proposed: (1) A slim-type TCP 117 with a narrow semiconductor chip formed thereon is used, as shown in FIG. 13 (Japanese Design Patent Application No. 2-40145); and (2) as described with reference to FIG. 11, a portion of a TCP 117' which extends off a glass substrate is bent (Japanese Laid-Open Patent Publication No. 2-132418).

According to the method shown in FIG. 13, a material used for a TCP itself is also reduced, which contributes to a reduction in costs. However, it is necessary to decrease the width of a printed wiring board in accordance with the width of a portion of a TCP which extends off a glass substrate. When the width of the printed wiring board is decreased without changing the wiring density, it is necessary to increase the number of layers of the printed wiring board. This results in an increase in costs. In addition, since the width of a connected portion of the printed wiring board and the TCP is very small, it is difficult to mount the TCP onto the printed wiring board. This may adversely influence the yield and reliability of the semiconductor device. These problems become serious in circumstances where liquid crystal panels are increasing in size.

As shown in FIG. 13, even when the above-mentioned slim-type TCP is used, a portion with a width of about 5 mm necessarily extends off the glass substrate. FIG. 10 is a schematic plan view (the bezel 116 is omitted) of a liquid crystal panel constructed as illustrated in FIG. 13.

In the case where the bent TCP 117' is used, as shown in FIG. 11, the printed wiring board 118 may be provided either on the upper surface or on the lower surface of the lower glass substrate 111. In the case where the printed wiring board is provided on the lower surface of the lower glass substrate 111, the wiring of the liquid crystal panel 100 can be connected to the printed wiring board 118 via the bent TCP 117'. Therefore, the printed wiring board 118 need not extend beyond the liquid crystal panel 100. Accordingly, the problem associated with large size devices can be solved to some degree. In the case shown in FIG. 11, the width of a portion of the TCP which extends off the glass substrate is only 2 mm (which is much smaller than that in the case as shown in FIG. 13).

However, in the case of using the bent TCP 117', there are the following problems: the length of the TCP 117' must be larger by the bent portion thereof, so that the costs for a tape carrier portion of the TCP 117' are higher; it is easier to connect the printed wiring board 118 to the TCP 117' compared with the case where the above-mentioned slim-type TCP 117 is used, however, the TCP 117' must be bent to a predetermined shape after the TCP 117' is connected to the printed wiring board 118, so that the TCP 117' is fixed to the printed wiring board 118, so that the TCP 117' is fixed to the printed wiring board 118; and the thickness of a liquid crystal module becomes larger by the total thickness of the printed wiring board 118 and the TCP 117' (i.e., about 2.5 mm to 3 mm), compared with the case where the slim-type TCP 117, as shown in FIG. 13, is used.

According to the COG method, a semiconductor chip is directly mounted onto a glass substrate, so that the costs for packaging are less, compared with the case where a TCP is used. Furthermore, when an input signal is adapted to be supplied to a semiconductor chip via wiring on a glass substrate, a printed wiring board is not required. This results in a decrease in costs. Still furthermore, according to the COG method, a semiconductor chip is merely mounted onto a glass substrate, so that the costs for mounting can be reduced.

However, the above-mentioned advantages cannot be obtained from currently used large liquid crystal panels with a 10-inch or more diagonal screen for the following reason: the sheet resistance of the wiring material on a glass substrate is high; therefore, in the case where an input signal is supplied to a semiconductor chip via wiring on the glass substrate, the wiring resistance cannot be minimized; and as a result, voltage drops in the wiring, which makes it impossible to transmit a normal signal to a semiconductor chip. In relatively small liquid crystal panels with about a 3- to 6-inch diagonal screen, the wiring length is small, so that the material sheet resistance is negligible. Accordingly, the above-mentioned advantages can be obtained only from relatively small liquid crystal panels.

However, when the above-mentioned structure is applied to small liquid crystal panels using the COG method, there are the following problems: since it is required to prescribe the width of wiring on a glass substrate to be large, the area of the glass substrate for mounting semiconductor chips is required to be made larger, compared with the case where TCPs are used; this requires the size of the glass substrate to be increased. In this case, the number of liquid crystal panels obtained from mother glass decreases. Thus, even in the case where the COG method is used for small liquid crystal panels, cost is not likely to decrease as far as an entire module is concerned.

In order to solve the problem associate with the enlargement of an area of a glass substrate for mounting semiconductor chips, as shown in FIG. 12, it is possible to adopt a method for directly connecting a flexible substrate 122 to the wiring on a glass substrate in the vicinity of a portion for mounting each semiconductor chip 104 and transmitting an input signal from the flexible substrate 122. (Japanese Laid-Open Utility Model Publication No. 4-77134). According to this method, a printed wiring board is not required, however, the flexible substrate 122 is used. Therefore, advantages in terms of lower production costs and fewer steps cannot be obtained.

Furthermore, according to the COG method, bare chips are supplied onto a glass substrate. The bare chips are generally tested in a wafer state, and they are not tested after being divided into individual chips by dicing. Thus, it is difficult to judge whether or not a particular semiconductor chip to be mounted onto a glass substrate is satisfactory. That is, a semiconductor chip to be mounted is not a "known good die." Because of this, in the case of a large liquid crystal panel in which a number of semiconductor chips are mounted, there are more chances of failures and repairs, resulting in an increase in costs.

SUMMARY OF THE INVENTION

A tape carrier package of the present invention includes: a tape carrier including an insulating film having a through-hole, a conductor pattern formed on the insulating film including leads projecting into the through-hole, and inner wiring electrically connected to a part of the conductor pattern; a semiconductor chip provided in the through-hole, having connecting bumps electrically connected to end portions of the leads; and an anisotropic conductive resin provided so as to cover at least a portion of the semiconductor chip including a junction of the connecting bumps and the end portions of the leads.

In one embodiment of the present invention, the anisotropic conductive resin is made of an insulating resin containing fine particles having conductivity, and the insulating resin is selected from the group consisting of a thermosetting resin, a UV-curing resin, and a thermoplastic resin.

In one embodiment of the present invention, the semiconductor chip includes intra-chip wiring and at least one bump for the intra-chip wiring.

In one embodiment of the present invention, an electronic device different from a semiconductor chip is mounted on the inner wiring provided on the tape carrier.

The liquid crystal display device of the present invention comprising: a liquid crystal panel including a pair of glass substrates and connecting wiring formed on at least one of the glass substrates; and at least two tape carrier packages mounted on a periphery of the liquid crystal panel, wherein each tape carrier package comprises: a tape carrier including an insulating film having a through-hole, a conductor pattern formed on the insulating film including leads projecting into the through-hole; a semiconductor chip provided in the through-hole, having connecting bumps electrically connected to end portions of the leads; and an anisotropic conductive resin provided so as to cover at least a portion of the semiconductor chip including a junction of the connecting bumps and the end portions of the leads, and the connecting bumps on the semiconductor chip of the tape carrier package and the connecting wiring of the glass substrate are electrically connected via the anisotropic resin provided on the tape carrier packages, thereby signals can be transmitted/received between the semiconductor chips of the adjacent tape carrier packages.

In one embodiment of the present invention, the anisotropic conductive resin is made of an insulating resin containing fine particles having conductivity, and the connecting bumps of the semiconductor chip and the connecting wiring of the glass substrate are electrically connected via the fine particles having conductivity.

In one embodiment of the present invention, the semiconductor chip includes intra-chip wiring and at least one bump for the intra-chip wiring.

In one embodiment of the present invention, the tape carrier packages are mounted on the liquid crystal panel so that the tape carrier has a portion projecting from the liquid crystal panel, the projecting portion being bent.

In one embodiment of the present invention, the tape carrier packages are mounted on the liquid crystal panel so that the tape carrier has a portion projecting from the liquid crystal panel, at least a portion of the conductor pattern and the inner wiring which are formed on the projecting portion of the tape carrier being exposed, and a metal leads are provided so as to electrically connect the exposed portions of the adjacent tape carrier packages.

Thus, the invention described herein makes possible the advantages of (1) providing a tape carrier package in which a printed wiring board which has been conventionally required can be omitted and the consequent fabrication step of mounting of a printed wiring board can be omitted; and (2) providing a liquid crystal display device provided with tape carrier packages.

These and other advantages of the present invention will become apparent to those skilled in the art upon reading and understanding the following detailed description with reference to the accompanying figures.

BRIEF DESCRIPTION OF THE DRAWINGS

FIG. 9A is a plan view showing a state where a TCP is mounted on a liquid crystal display device of Embodiment 3 according to the present invention;

FIG. 9B is a cross-sectional view taken along a line 9B–9B' in FIG. 9A; and

DESCRIPTION OF THE PREFERRED EMBODIMENTS

Figure 1:
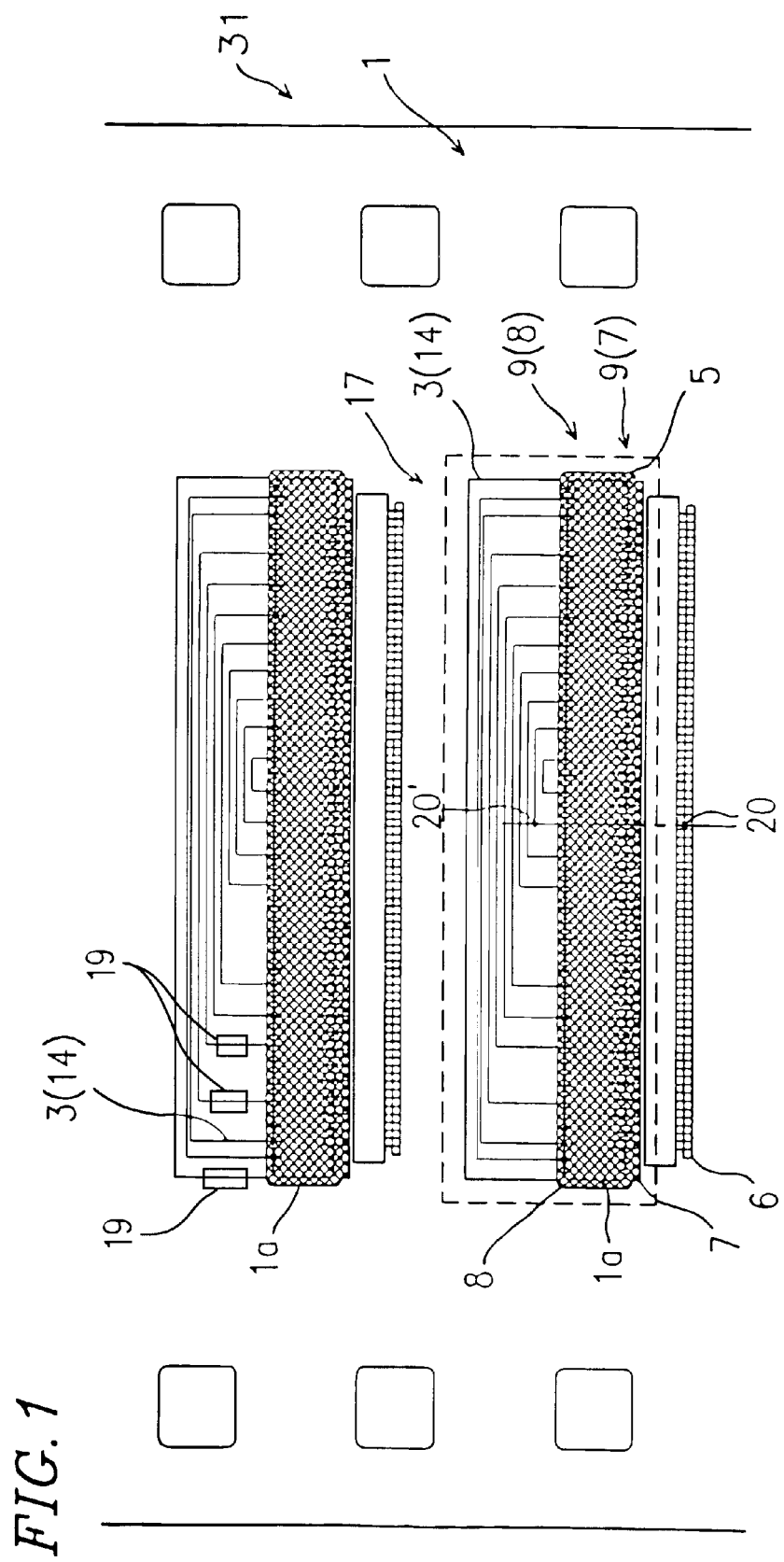
FIG. 1 is a plan view of TCPs of Embodiment 1 according to the present invention arranged on a tape carrier before the tape carrier is cut into individual TCPs.

First, the function of the present invention will be described.

Leads provided in a TCP are not limited to inner leads to be connected to a semiconductor chip and outer leads to be connected to a liquid crystal panel. They include wiring to be connected to other components, e.g., intra-tape carrier wiring described later.

According to the present invention, the surface of a semiconductor chip including connecting bumps which is mounted on a TCP is covered with an anisotropic conductive resin in place of an ordinary resin, whereby the surface of the semiconductor chip, the connecting bumps, and leads (in particular, inner leads) are prevented from being damaged before the TCP is mounted onto a liquid crystal panel. The TCP is mounted onto the liquid crystal panel by face down bonding in such a manner that the anisotropic conductive resin faces the wiring on the liquid crystal panel, whereby connecting bumps of the semiconductor chip are electrically connected to the wiring on the liquid crystal panel through the end portions of the inner leads. The connecting bumps are mainly electrically connected to the inner leads on a tape carrier.

Thus, a signal input through the wiring on the liquid crystal panel is supplied to the semiconductor chip via the inner leads and the connecting bumps. Then, the signal is transmitted through the wiring in the semiconductor chip (hereinafter, referred to as "intra-chip wiring"), returns to the wiring on the liquid crystal panel via other connecting bumps and inner leads, and is supplied to the terminals of an adjacent TCP. This eliminates multi-layer wiring used in conventional printed wiring boards and enables an input signal to be transmitted/received with low wiring resistance without using an external substrate such as a flexible substrate and a printed wiring board.

Because of the above-mentioned structure, the TCP can be subjected to an electric diagnostic test through leads, which makes it easy to judge whether or not the TCP mounted using the COG method is satisfactory. Furthermore, the TCP is merely mounted onto the liquid crystal panel without connecting input signal terminals. This allows substantial simplification of the fabrication steps.

In the case of repairing the TCP in the liquid crystal display device of the present invention, the TCP is detached from the liquid crystal panel and only the liquid crystal panel is washed before another TCP is attached thereto. Therefore, time and effort associated with repairing the device can be reduced by half, compared with conventional devices.

Furthermore, the portion of the TCP which extends off the liquid crystal panel can be minimized (about 2 mm or less) by being bent when a bezel or the like is mounted. Since a printed wiring board is omitted, the thickness of the entire device is not increased even when the above-mentioned portion of the TCP is bent.

Since a printed wiring board with a large coefficient of linear expansion is not used, the reliability of the obtained device improved with respect to changes in temperature, compared with conventional devices. Furthermore, since movable components such as conventional TCPs and a printed wiring board are not used, a mechanical reliability comparable to that obtained by using the COG method can be obtained with respect to vibration or the like.

Hereinafter, preferable embodiments of the present invention will be described.

Embodiment 1

Figure 2:
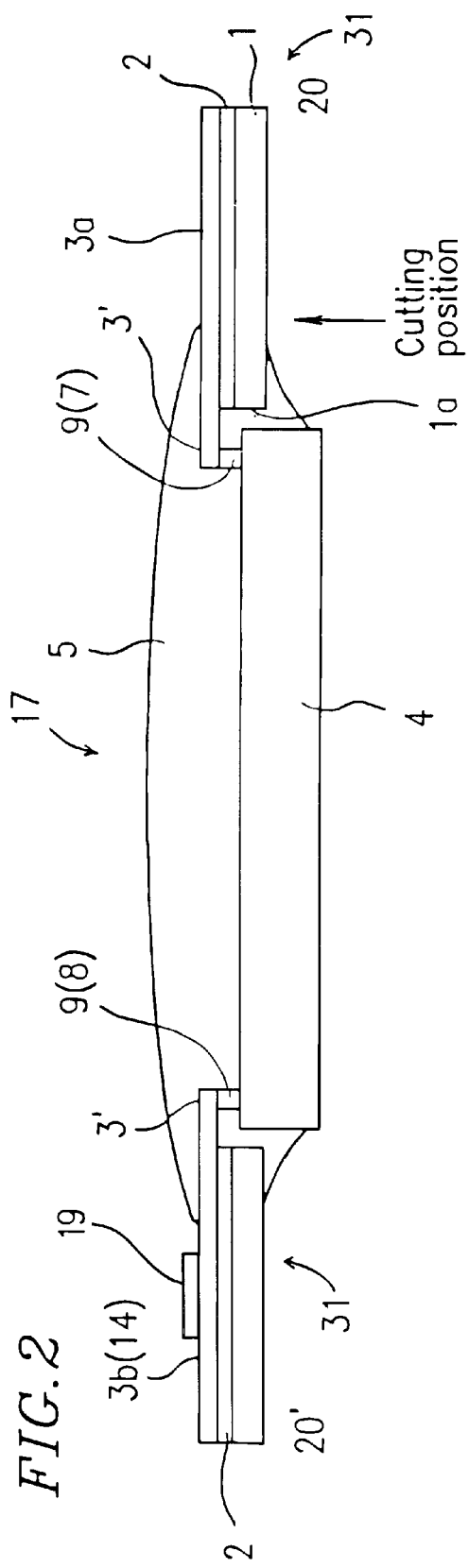
FIG. 2 is a cross-sectional view of the TCP taken along a line 20–20' in FIG. 1.

FIG. 1 is a plan view of TCPs 17 of Embodiment 1 arranged on a tape carrier 31. FIG. 2 is a cross-sectional view of the TCP 17 taken along a line 20–20' in FIG. 1.

Each TCP 17 has a structure in which a semiconductor chip 4 is provided on a long tape carrier 31. The semiconductor chip 4 is provided with a circuit portion of connecting bumps (not shown) made of gold or any other conductive metal at any portion of its upper surface. Bumps 9 are arranged in two rows (an input terminal array 8 and an output terminal array 7) on both sides of the semiconductor chip 4.

The tape carrier 31 includes a tape substrate 1 made of an insulating film (thickness: 50 μm; Upilex produced by Ube Industries, Ltd.). Leads 3 (conductor pattern) made of electrolytic copper foil (thickness 18 μm) or any other conductive metal are formed in a predetermined pattern on the tape substrate 1 with an adhesive layer 2 interposed therebetween. Through-holes 1a, which are device holes for mounting the semiconductor chips 4, are formed at predetermined intervals. End portions 3' of inner leads of the leads 3,k which are obtained by patterning the copper foil, project into the through-holes 1a.

As a material for the tape substrate 1, insulating films made of another polyimide such as Apical (produced by Kaneka Corporation) and Kapton (produced by Toray-Du Pont Co., Ltd. and Du Pont Co., Ltd.) may be used in place of the above-mentioned Upilex. Furthermore, insulating films made of glass, epoxy, aramid, BT resin, polyethylene terephtharate, polyphenyl ether, etc. may be used. The leads 3 may be directly formed on the tape substrate 1 in a predetermined pattern without an adhesive layer 2 interposed therebetween.

The leads 3 are provided with a conductive plating (thickness: 0.2 μm) made of tin, and the end portions 3' of the inner leads of the leads 3 are thermocompression-bonded (inner lead bonding) onto the bumps 9 on the semiconductor chip 4. The leads 3 may be provided with a Ni/Au plating in place of tin plating.

As shown in FIG. 2, an anisotropic conductive resin 5 is provided so as to cover the connected portions between the inner leads of the leads (3a, 3b) and the semiconductor chip 4. The periphery of the semiconductor chip 4 is sealed with the anisotropic conductive resin 5. As the anisotropic conductive resin 5, a thermosetting insulating resin having an initial viscosity of 300 to 500 cps is used so that potting can be conducted. Conductive particles (fine particles having conductivity) which are made of plastic balls having a diameter of about 3 μm coated with gold are mixed in the anisotropic conductive resin 5. The anisotropic conductive resin 5 is provided as follows: after inner lead bonding, potting of the anisotropic conductive resin 5 onto the surface of the semiconductor chip 4, where a junction between the connecting bumps 9 and the inner leads (3a, 3b) is provided, is conducted through a nozzle; and the anisotropic conductive resin 5 is provisionally cured at 70° C. for 20 minutes. The anisotropic conductive resin 5 is required to keep its function for 6 months after provisional curing.

The TCP 17 is subjected to an electronic diagnostic test using a test pad 6 provided on the TCP 17. In this way, the construction of the TCP 17 is completed. In the case where electronic components 19 such as a chip capacitor are mounted, they are mounted in a predetermined region of the TCP 17 before the periphery of the semiconductor chip 4 is sealed with the anisotropic conductive resin 5. The electronic components 19 are mounted, for example, in a predetermined region on wiring 14 in the tape carrier 31 (hereinafter, referred to as "Intra-tape carrier wiring", or inner wiring) formed as the leads 3 or in a predetermined region on the semiconductor chip 4. The semiconductor chip 4 may be sealed before or after inner lead bonding.

After completion of the electric test, the test pad 6 is not required. Therefore, the test pad 6 is cut away along a cutting position indicated by a broken line in FIG. 1. As a result, as shown in FIG. 2, the leads 3a connected to the connecting bumps 9 of the output terminal array 7 are positioned on the periphery of the TCP 17. The surface of a portion of the leads 3b (including the intra-tape carrier wiring 14) exposed from the anisotropic conductive resin 5 is covered with a solder resist (not shown).

Figure 3:
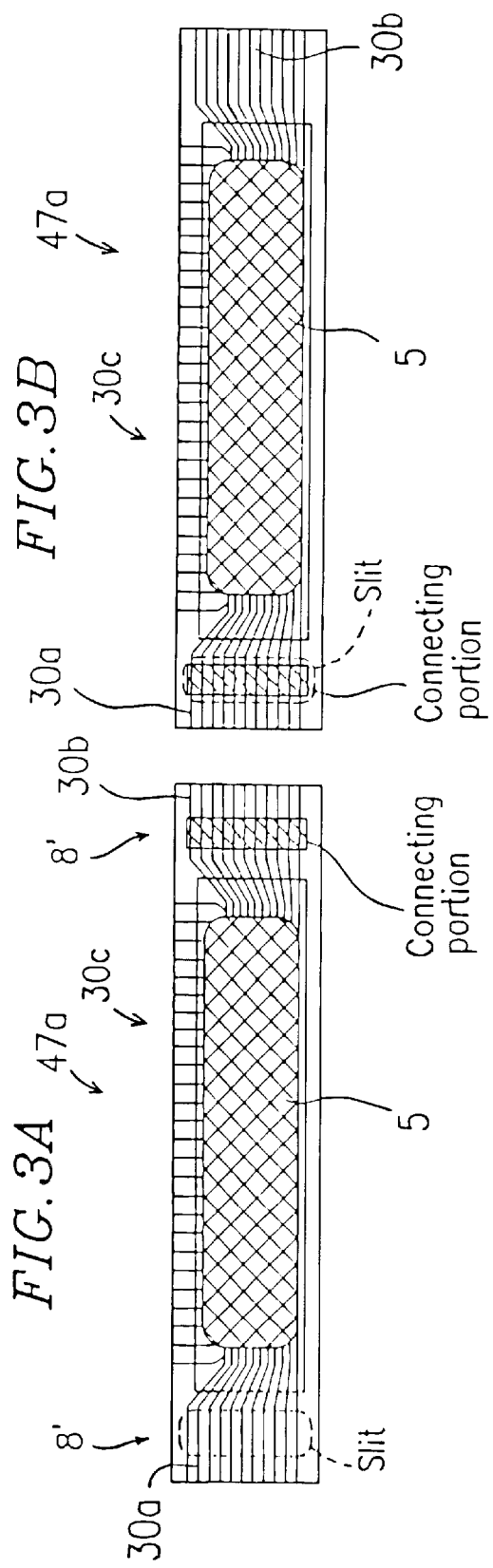
FIG. 3A shows a structure of another TCP according to the present invention.
FIG. 3B shows a state where input terminals of the TCP are connected to a liquid crystal panel.

The TCP of Embodiment 1 is not limited to the above-mentioned structure. A TCP having a structure as shown in FIGS. 3A and 3B may also be used. In the TCP 17 shown in FIG. 1, the input terminal array 8 (connecting bumps 9) is provided on one side of the semiconductor chip 4, and the end portions 3' of the inner leads of the leads 3 are positioned on both inner sides of the through-hole 1a.

In a TCP 47a shown in FIGS. 3A and 3B, input terminal arrays 8' are provided on both sides of the anisotropic conductive resin 5. Terminals on one side are connected to those on the other side via the intra-chip wiring. As shown in FIG. 3A, leads (30a, 30b, 30c) are provided in three directions. Among them, the leads 30a and 30b are connected to the input terminal arrays 8' on the TCP 47a formed in two directions. In FIGS. 3A and 3B, the outer leads of the leads 3 are shown. The connection of the TCP 47a is conducted as follows: the leads 30a on one side are exposed to the reverse surface of the TCP 47a through a slit provided on the tape carrier, and a connecting portion provided on the tape carrier, and a connecting portion provided so as to project on the right side of the TCP 47a, as shown in FIG. 3A, is inserted into the slit (FIG. 3B). The connecting portion has a structure in which the leads 30a projecting from the tape carrier are in contact with the leads 30b in the slit portion of the adjacent TCP 47a.

In the present embodiment, a heat-curable resin is used as an insulating resin material for the anisotropic conductive resin. However, the present invention is not limited thereto, and a thermoplastic resin may be used. In the case of using a thermoplastic resin, mounting can also be conducted by the same method as described above. Furthermore, a UV-curing resin or the like may be used in place of a thermosetting resin. In this case, mounting can be conducted in the same manner as described above merely by altering a method for curing a resin and conditions thereof.

Embodiment 2

Figure 4:
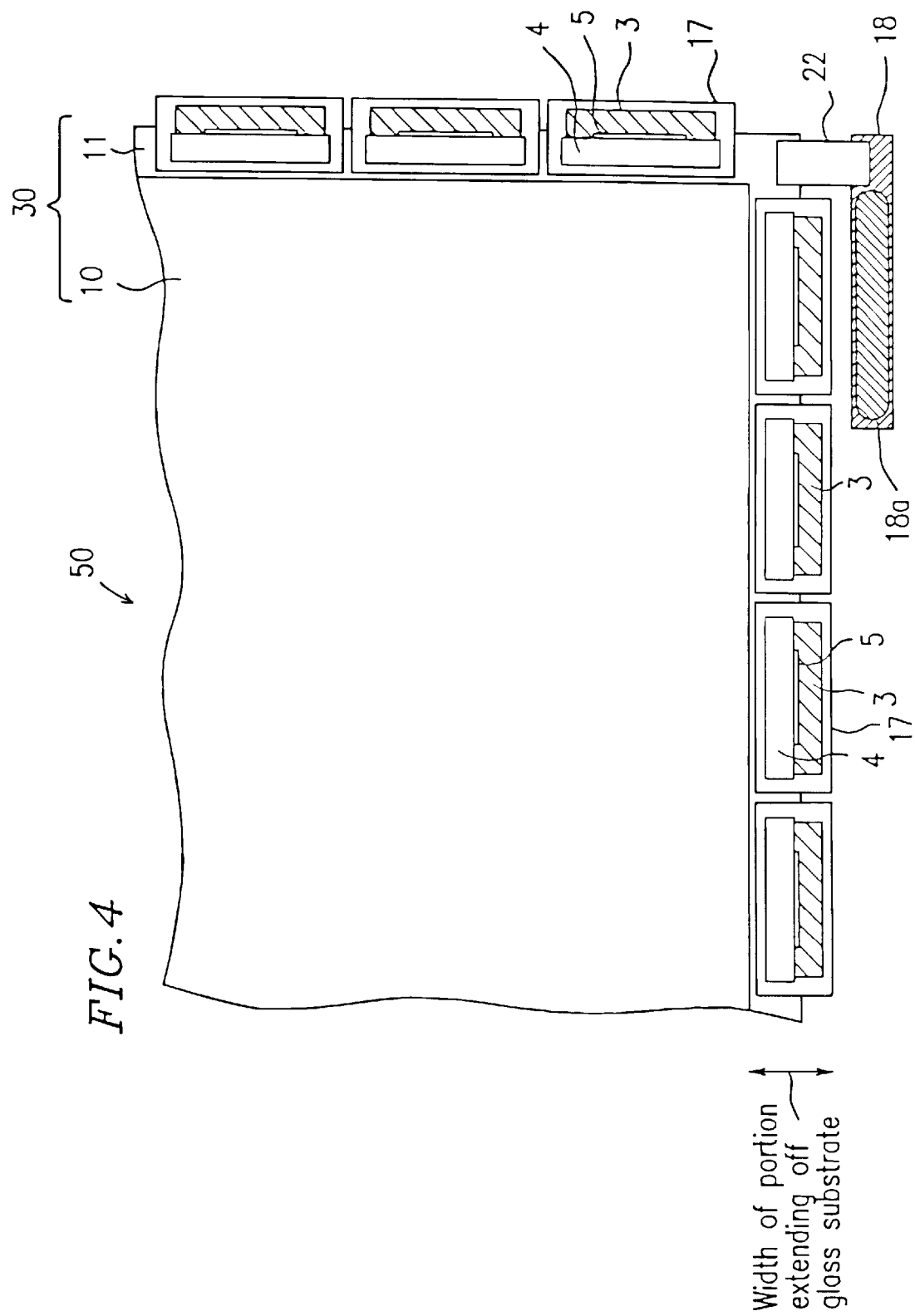
FIG. 4 is a plan view schematically showing a liquid crystal display device of Embodiment 2 according to the present invention.
Figure 5:
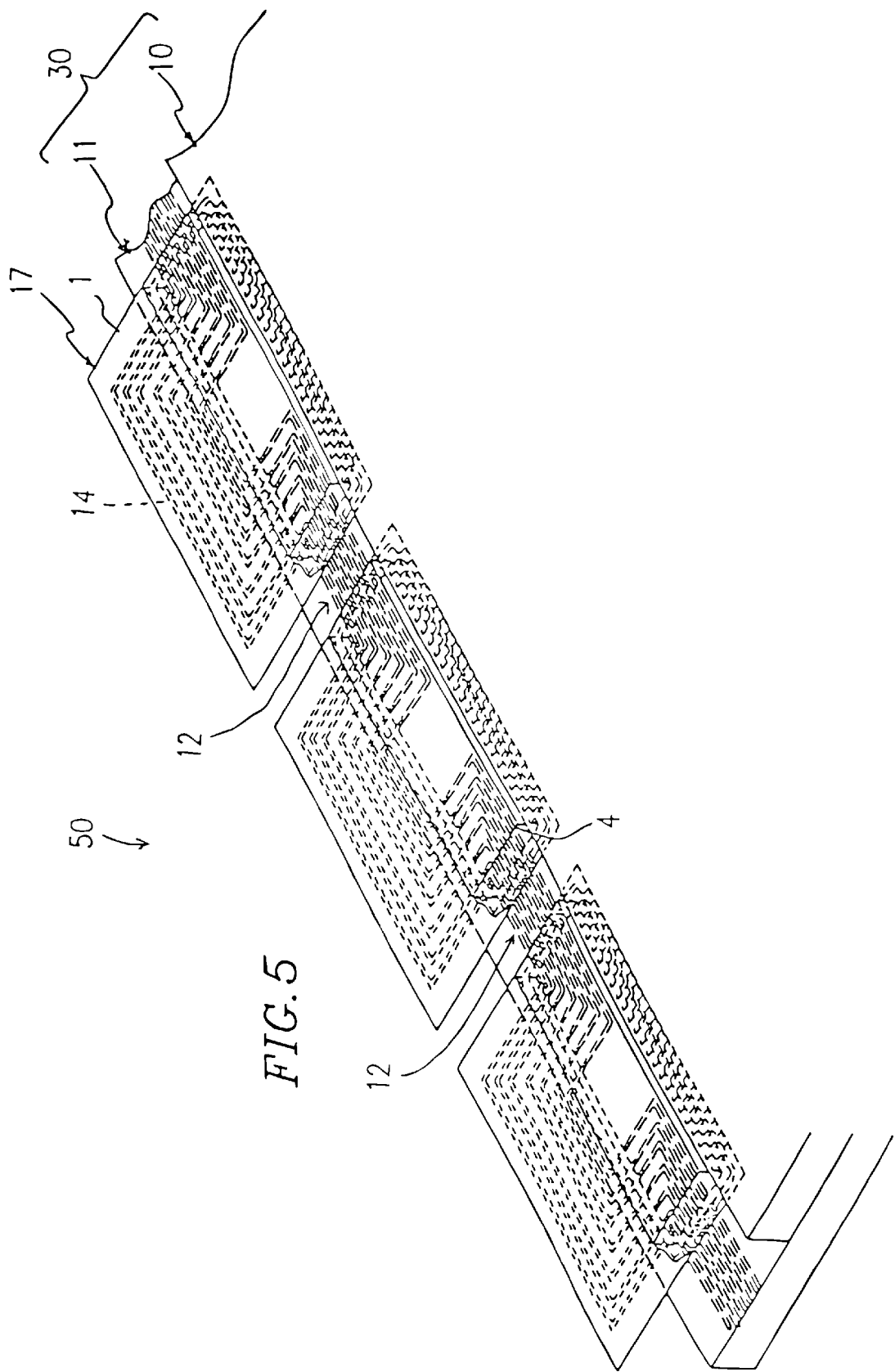
FIG. 5 is a perspective view showing a provisional connection between a TCP and a glass substrate in the device shown in FIG. 4.
Figure 6:
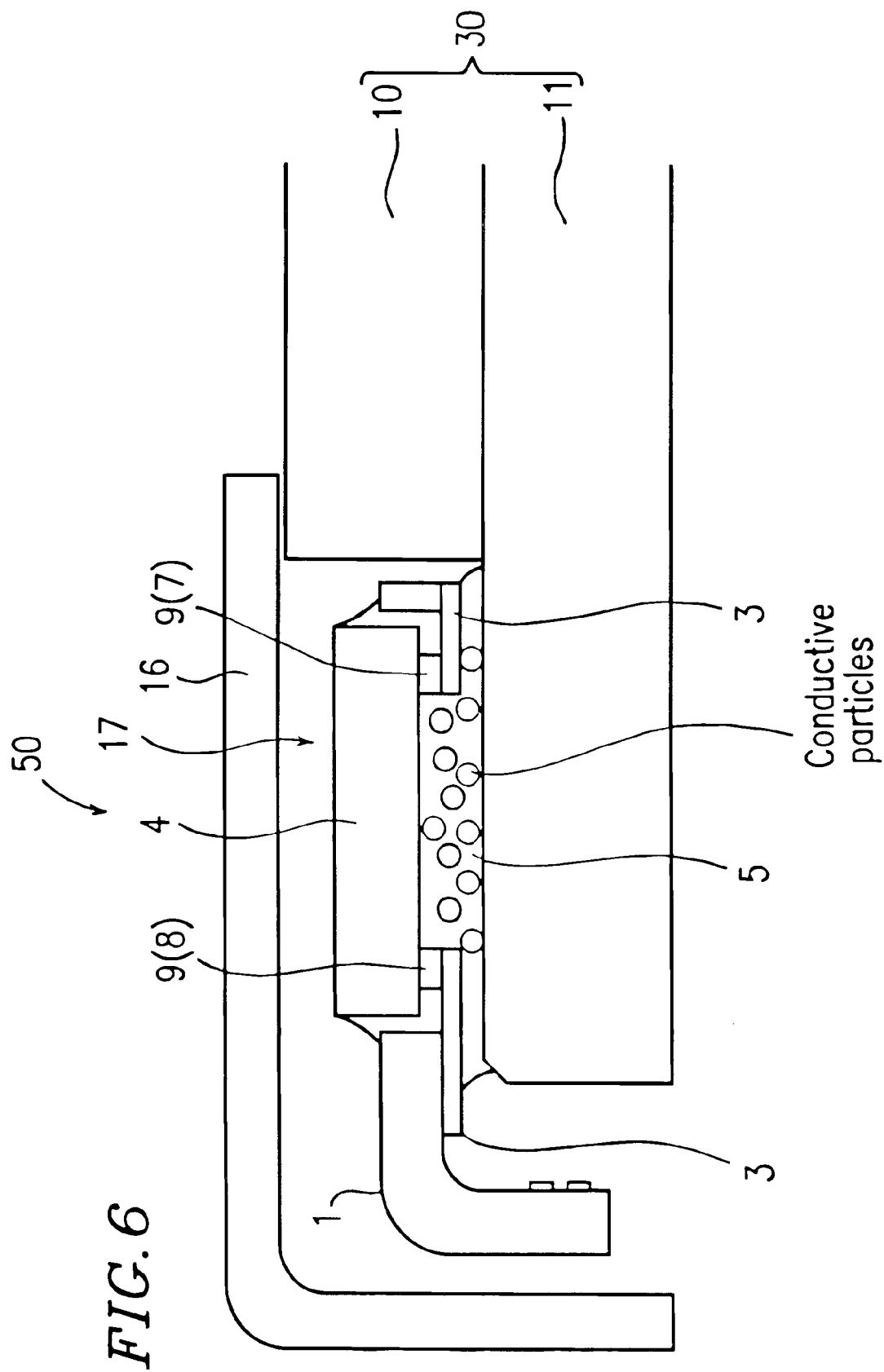
FIG. 6 is a cross-sectional view showing the connection between a TCP and a glass substrate as shown in FIG. 5.

FIG. 4 is a plan view schematically showing a liquid crystal display device 50 of Embodiment 2 according to the present invention. FIG. 5 is a perspective view showing a provisional connection between a TCP 17 and a glass substrate 11 in the device shown in FIG. 4. FIG. 6 is a cross-sectional view showing the connection between a TCP 17 and a glass substrate 11 as shown in FIG. 5.

The liquid crystal display device 50 has a simple matrix type liquid crystal panel 30, for example, with an 11.3-inch SVGA diagonal screen. TCPs 17 for driving the liquid crystal are provided on the periphery of the liquid crystal panel 30 (for example, 10 each on the right side and the lower side). Each TCP has about 240 output signal lines and about 20 input signal lines. The TCPs 17 are provided on the right and lower sides in FIG. 4. However, they may be provided on any side such as the upper side and the left side.

The liquid crystal display device 50 of the present embodiment is produced as follows.

First, a tape carrier 31 having TCPs 17 as shown in FIG. 1 is cut to a predetermined shape along a cutting position (indicated by a broken line) with a die or the like.

The TCPs 17 thus obtained are aligned at predetermined positions on a lower glass substrate 11 and provisionally connected thereto. At this time, terminal portions (i.e., outer leads) of intra-tape carrier wiring 14 provided on each TCP 17 are arranged to correspond to wiring 12 on the lower glass substrate 11, as shown in FIG. 5, whereby the TCPs 17 are positioned. It is noted that all the TCPs 17 provided on the periphery of the liquid crystal panel 30 are provisionally connected to the lower glass substrate 11.

As shown in FIG. 6, after all the TCPs 17 are provisionally connected to the lower glass substrate 11, they are crimped onto the lower glass substrate 11 so as to be fixed thereto. At this time, an anisotropic conductive resin 5 melts and uniformly spreads between the TCPs 17 (the semiconductor chip 4) and the upper surface of the lower glass substrate 11. Thus, mounting of the TCPs 17 is completed.

Figure 7:
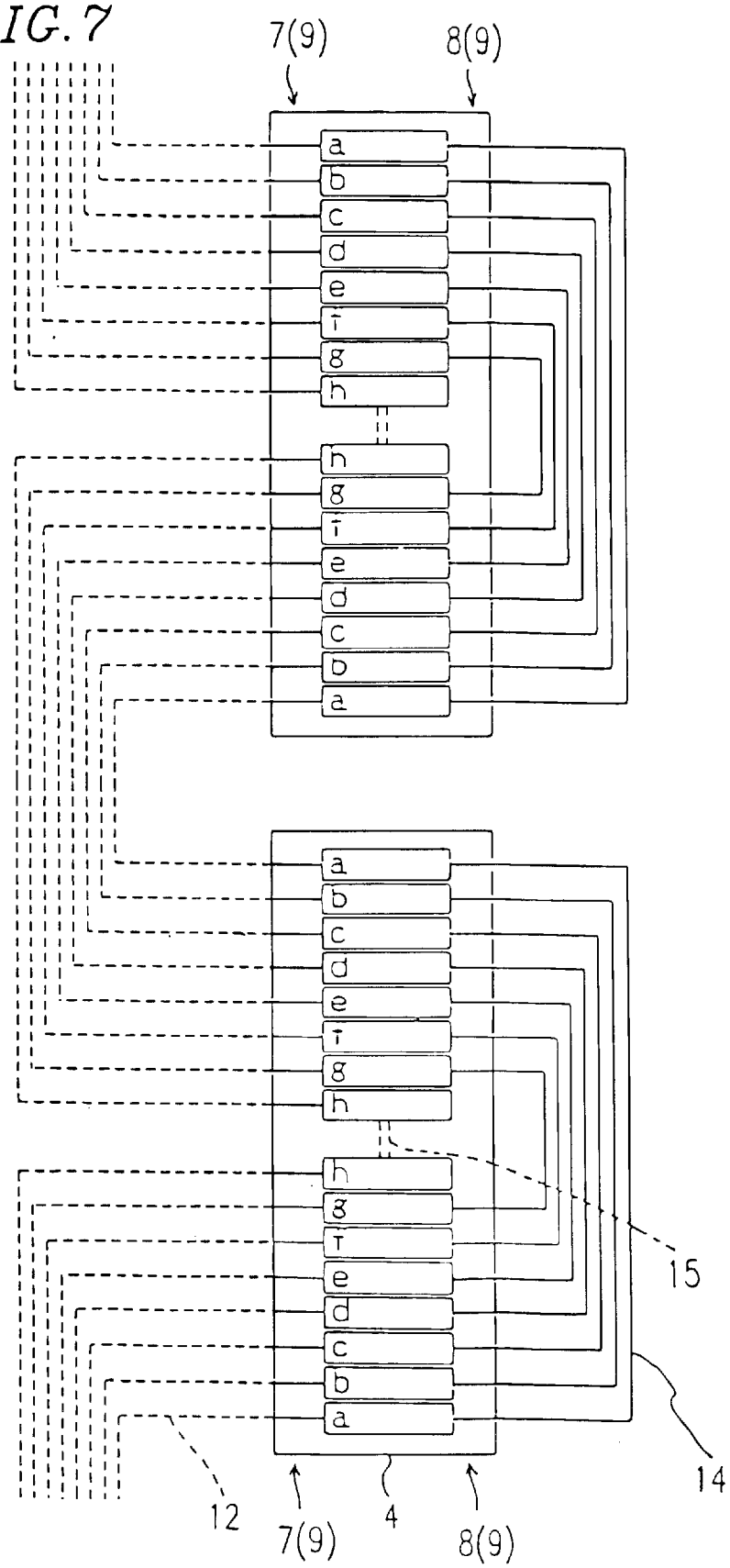
FIG. 7 is a wiring diagram showing an inner structure of a semiconductor chip used for the liquid crystal display device of Embodiment 2 according to the present invention.

FIG. 7 shows an inner structure of a semiconductor chip 4. As shown in this figure, each semiconductor chip 4 includes two sets of connecting bumps a through h (corresponding to the input terminal array 8) and wiring 15 on a signal input side. The wiring 15 connects the innermost bumps (h—h) to each other.

As shown in FIG. 5, when the TCPs 17 are mounted on the lower glass substrate 11, the connecting bumps 9 on each semiconductor chip 4 electrically connected to the leads 3 are connected to the wiring 12. Thus, the adjacent TCPs 17 each provided with semiconductor chip 4 are connected to each other. As a result, an input signal can be transmitted between the adjacent TCPs 17. More specifically, as shown in FIG. 6, a signal input from the wiring 12 (not shown in FIG. 6) on the lower glass substrate 11 is supplied to the semiconductor chip 4 and the leads 3 through the connecting bumps 9 on the semiconductor chip 4. The signal given to the leads 3 is supplied to other leads 3 and connecting bumps 9 on the same semiconductor chip 4 via the intra-tape carrier wiring 14 and supplied to the adjacent TCP 17. In the semiconductor chip 4, the number of terminals or the connecting bumps 9 (e.g., 240) in the output terminal array 7 on the liquid crystal panel 10 side is larger than that of terminals or the connecting bumps 9 (e.g. 20 to 30) in the input terminal array 8 on the signal input side. Therefore, two sets of connecting bumps 9 (a through h corresponding to the input terminal array 8) on the signal input side can be used. Furthermore, since these two sets are connected via the intra-tape carrier wiring 14, a signal can be transmitted to the next semiconductor chip 4.

After mounting of the TCPs 17 is completed, a display diagnostic test is conducted. In the case where a malfunctioning TCP 17 is found, only that TCP 17 is repaired as follows: the TCP 17 which malfunctions is detached from the glass substrate by heating; the glass substrate is washed with a suitable solvent; and another satisfactory TCP 17 is mounted onto the glass substrate in the same process as described above.

Next, after the display diagnostic test is completed, a bezel 16 is attached as shown in FIG. 6. At this time, a portion of the tape substrate 1 made of a film which extends off the glass substrate 11 can be appropriately bent.

Regarding the liquid crystal display device 50 of Embodiment 2 and a liquid crystal display device produced using the COG method, in which all the input wiring is replaced by wiring (not shown) on a glass substrate, the calculation of input wiring resistance will be described with reference to FIG. 8.

Figure 8:
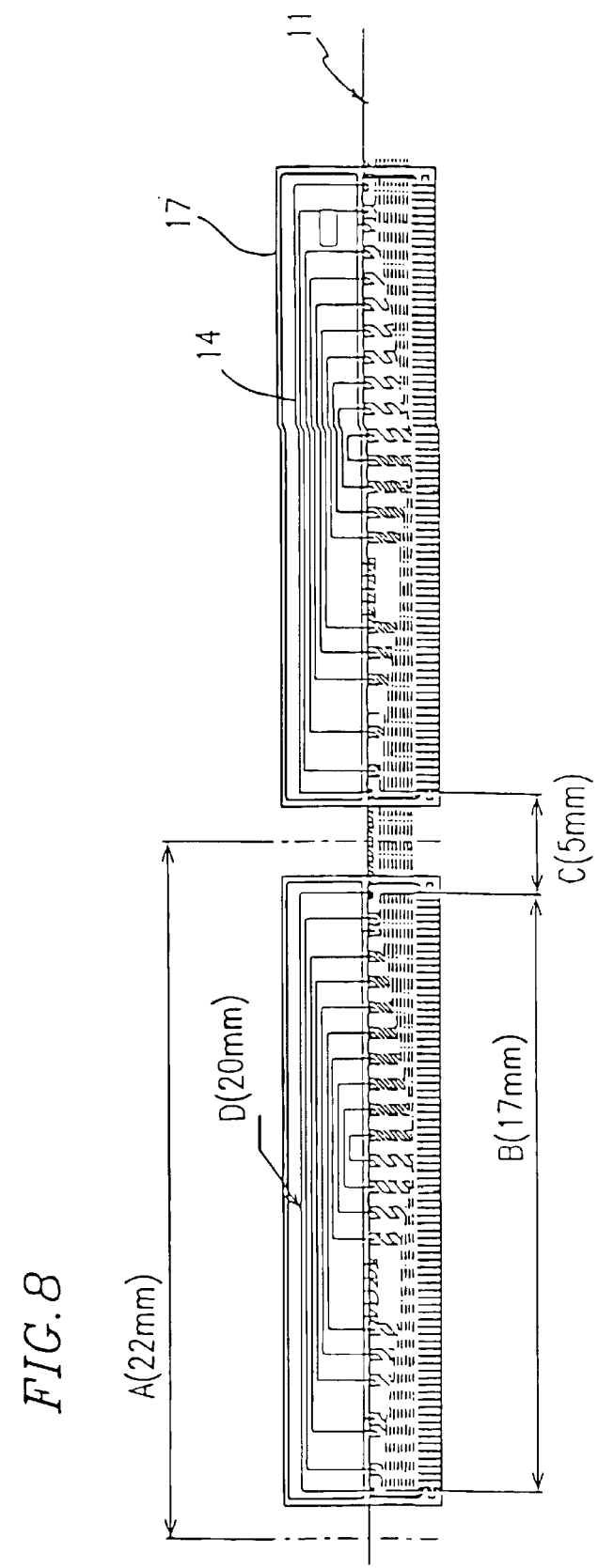
FIG. 8 is a diagram illustrating the calculation of wiring resistance under the condition that a TCP of the present invention is mounted.

Assuming in FIG. 8 that the length of a portion for mounting TCPs 17 in a liquid crystal panel with an 11.3-inch diagonal screen is about 220 mm (i.e., 10 TCPs 17 are arranged on one side of the panel), a length A for mounting each TCP 17 becomes about 22 mm. Assuming that a distance B between the outermost bumps of each semiconductor chip 4 is about 17 mm, a length C of the wiring 12 on the lower glass substrate 11 between the adjacent semiconductor chips becomes about 5 mm. As shown in FIG. 8, in the case of the present embodiment, the outermost bumps, the second outermost bumps, . . . , the innermost bumps in one semiconductor chip 4 are connected to each other via the intra-tape carrier wiring 14. A length D of the intra-tape carrier wiring 14 connecting the outermost bumps is about 20 mm per TCP. More specifically, in the case of the present embodiment, the total length of the intra-tape carrier wiring 14 in all the TCPs provided on one side of the liquid crystal panel 10 becomes about 200 mm (20 mm×10), and the total length of the wiring 12 on the lower glass substrate 11 becomes about 50 mm (5 mm×10). Furthermore, the bumps 9 are connected to the wiring 12 on the lower glass substrate 11 with the anisotropic conductive resin 5 at 20 (2×10) positions.

In the case of using the COG method, only the wiring on the lower glass substrate is used, and the total length thereof becomes about 220 mm. Furthermore, the connection of the wiring with the anisotropic conductive resin is conducted only once.

Assuming that the intra-tape carrier wiring 14 is made of copper (specific resistance: $1.7 \times 10^{-6}$ Ωcm), the sheet resistance of the wiring 12 on the lower glass substrate 11 is about 1 Ω/□, the width of the wiring 12 on the lower glass substrate 11 is about 1 mm, and the connection resistance of the anisotropic conductive resin 5 is about 0.1 Ω/□, the total wiring resistance on one side of the liquid crystal panel 10 becomes about 52 Ω in the case of the present embodiment. In contrast, in the case of using the COG method, the total wiring resistance becomes very high (i.e., about 220 Ω). Accordingly, compared with this conventional method, the present embodiment has outstanding effects for reducing the wiring resistance.

Embodiment 3

The case where adjacent TCPs are connected via metal leads in place of wiring on a glass substrate will now be described.

Figure 9C:
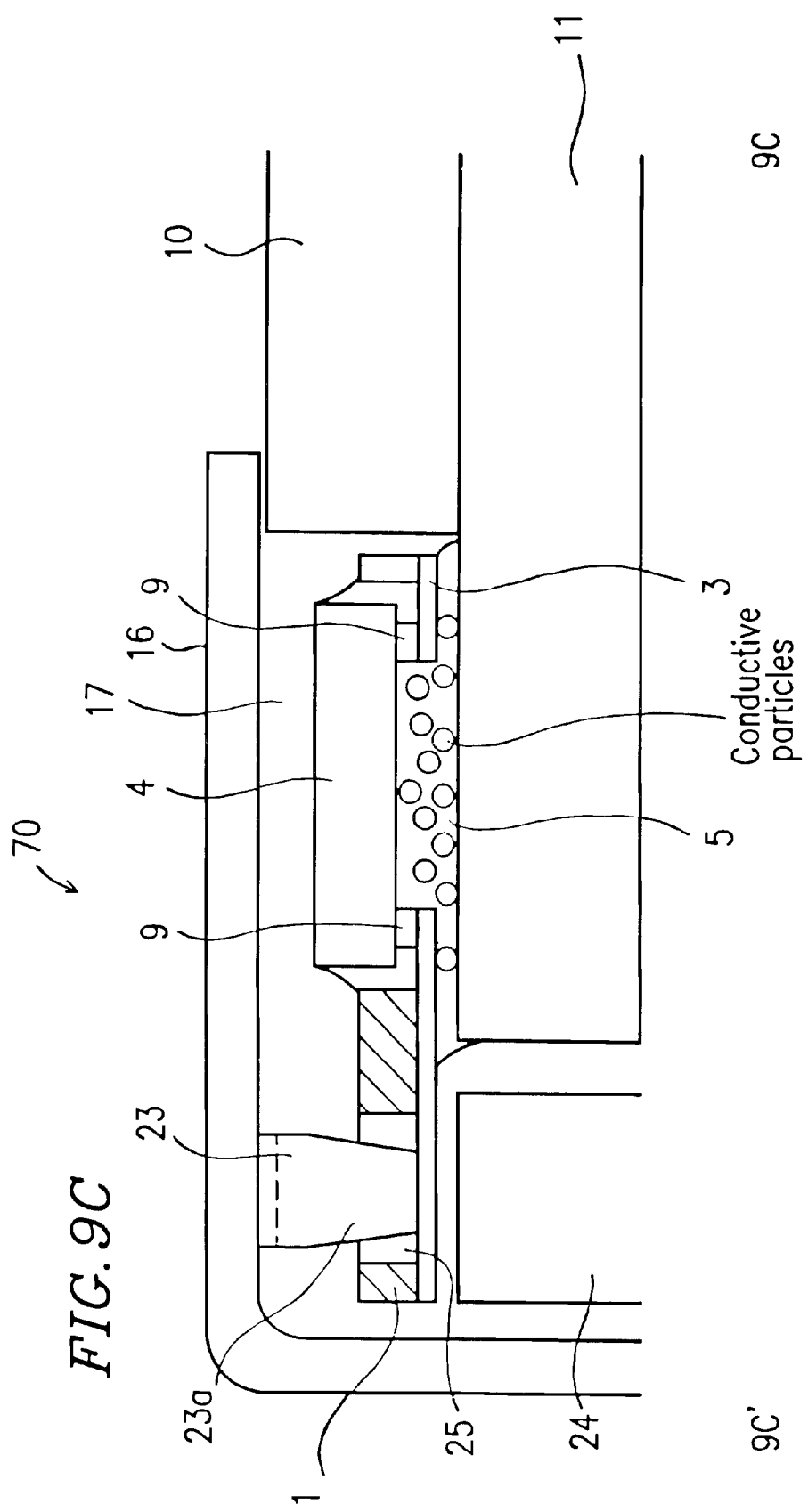
FIG. 9C is a cross-sectional view taken along a line 9C–9C' in FIG. 9A.
Figure 10:
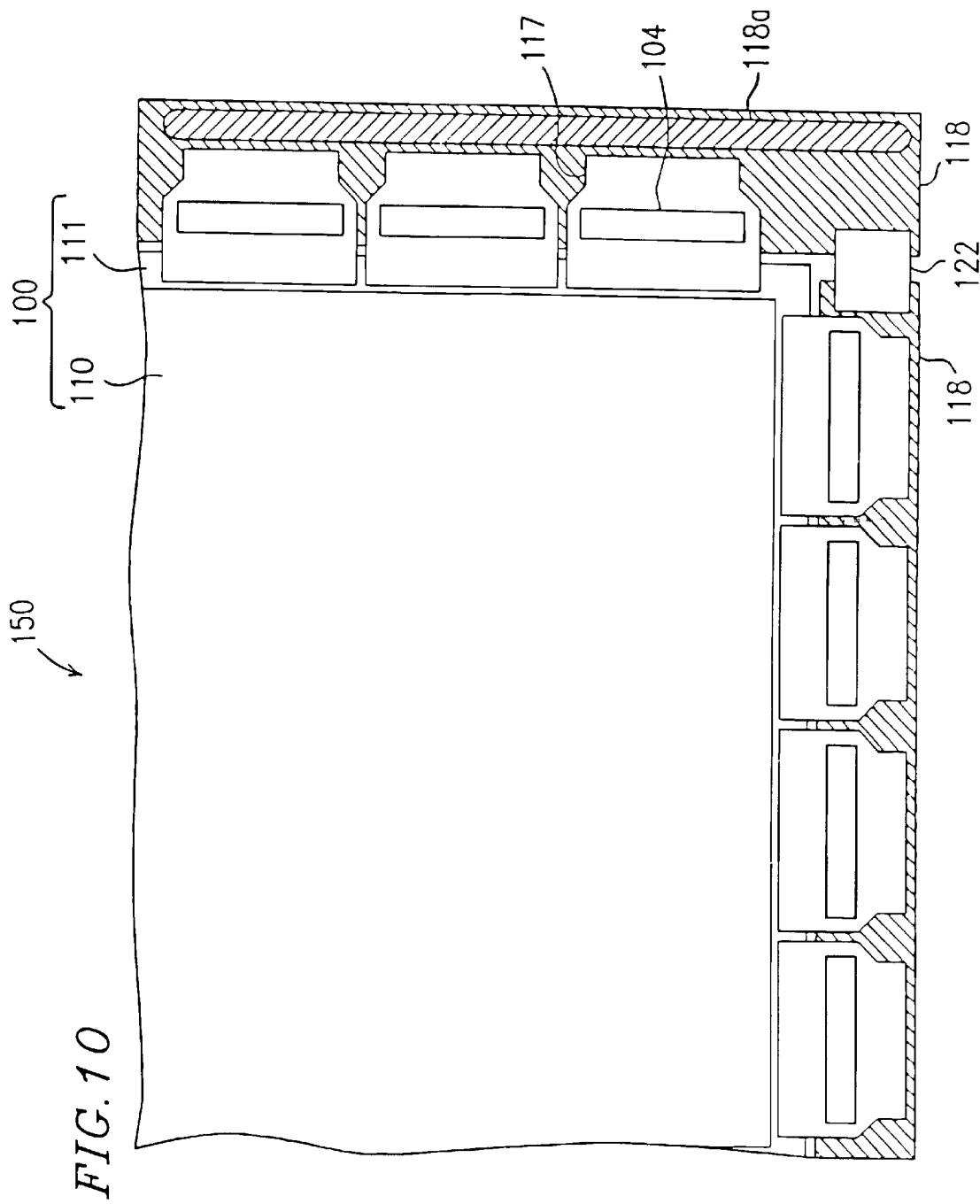
FIG. 10 is a plan view of a conventional liquid crystal display device.
Figure 11:
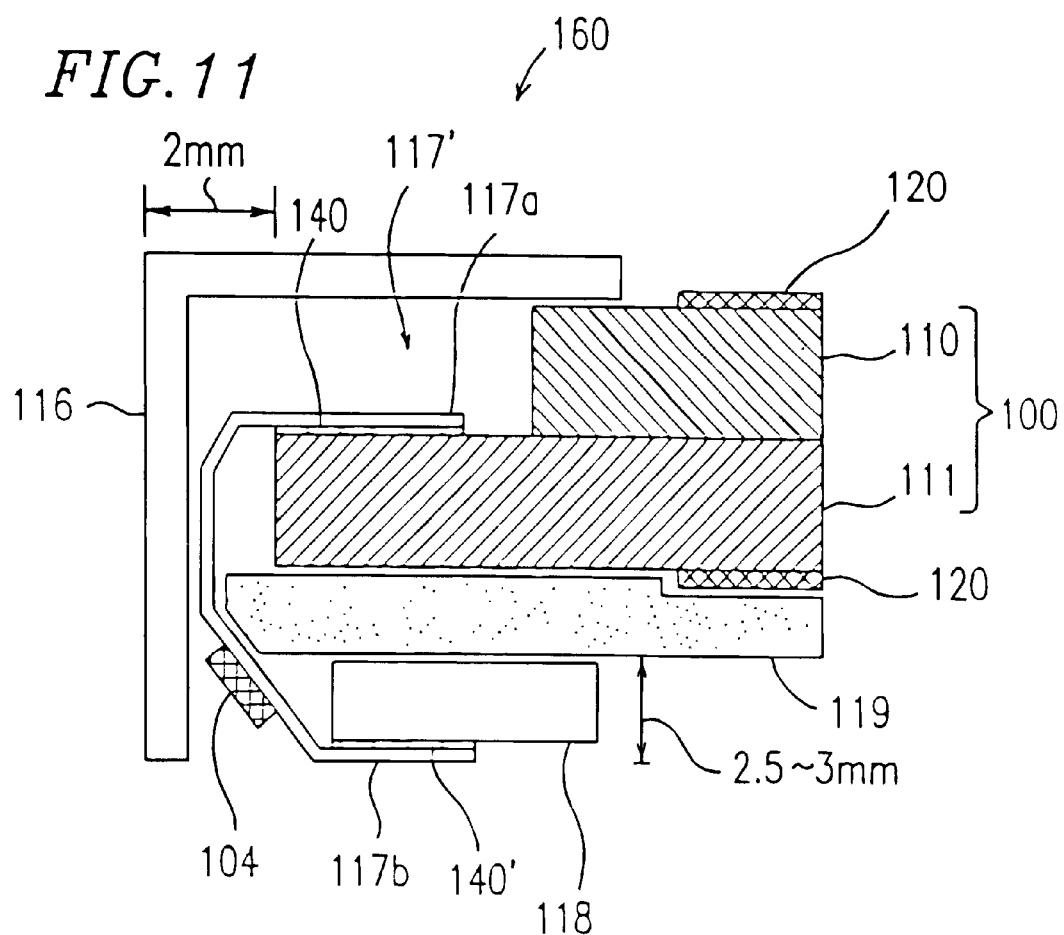
FIG. 11 is a cross-sectional view of a conventional liquid crystal display device using a bent TCP.
Figure 12:
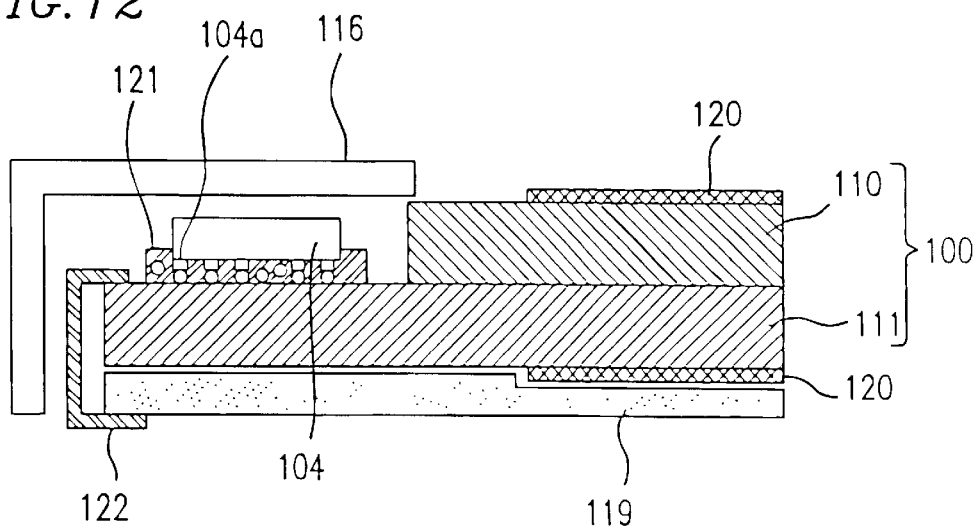
FIG. 12 is a cross-sectional view of a conventional liquid crystal display device in which a semiconductor chip is mounted by the COG method.
Figure 13:
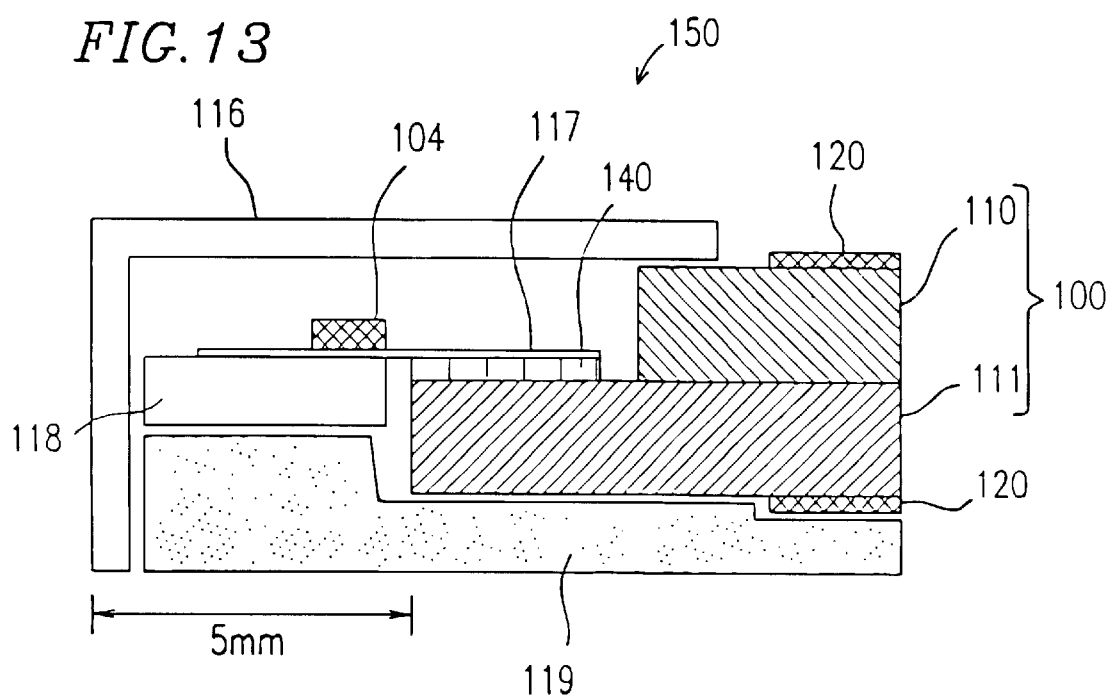
FIG. 13 is a cross-sectional view of the conventional liquid crystal display device shown in FIG. 10, using a slim-type TCP.

FIG. 9A is a plan view of a liquid crystal display device 70 having a structure in which elastic metal leads 23 provided inside a bezel 16 (not shown) are used for connecting adjacent TCPs 17 to each other, in place of a wiring portion on a glass substrate connected to a power source required to have low resistance in a large liquid crystal panel. FIG. 9B is a cross-sectional view taken along a line 9B–9B' in FIG. 9A. FIG. 9C is a cross-sectional view taken along a line 9C–9C' in FIG. 9A.

As shown in FIGS. 9A and 9B, a rectangular opening 25 with a side of 1 mm, for example, is provided in a film at a portion of input wiring of the TCP 17 connected to a power source, whereby connecting points 25' of the portion of the input wiring connected to the power source are exposed. The elastic metal leads 23 which are long enough to connect the exposed connecting points 25' are provided between the TCPs 17 adjacent each other in the vertical direction to the drawing surface. Both ends of the metal leads 23 are positioned at the exposed connecting points 25' and bent downward to form projections 23a. The bezel 16 is placed from above the metal leads 23, whereby the projections 23a are connected to the connecting points 25' due to a spring effect thereof. The connecting points 25' may be provided partially or entirely in an inner lead portion, an outer lead portion, or an intra-tape carrier wiring portion. As shown in FIG. 9C, the end portion of the TCP 17 is supported by a supporter 24 provided on an opposite side of the metal leads 23, when large force is applied to the end portion of the TCP 17.

In the present embodiment, metal leads 23 having smaller resistances than wiring printed on a glass substrate are used. Therefore, even in the case where liquid crystal panels further increase in size, wiring resistance can be prevented from increasing.

As described above, according to the present invention, a printed wiring board which has been required in the conventional devices can be omitted, and therefore, the related step of mounting of a printed wiring board can also be omitted. This results in a large decrease in production costs. Furthermore, according to the present invention, the width of the portion which extends off a glass substrate of a liquid crystal panel can be shortened by bending a TCP. Even when the TCP is bent, the consequent increase in thickness of the panel is negligible because a printed wiring board is not used. Thus, a liquid crystal module can be made smaller, thinner, and lighter.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A tape carrier package comprising:
   a tape carrier including an insulation film having a though-hole, a conductor pattern formed on the insulating film including leads projecting into the through-hole, and inner wiring electrically connected between inner leads projecting into the through-hole;
   a semiconductor chip provided in the through-hole, having connecting bumps electrically connected to end portions of the leads; and
   an anisotropic conductive resin provided so as to cover at least a portion of the semiconductor chip including a junction of the connecting bumps and the end portions of the leads.

2. A tape carrier package according to claim 1, wherein the anisotropic conductive resin is made of an insulating resin containing fine particles having conductivity, and the insulating resin is selected from the group consisting of a thermosetting resin, a UV-curing resin, and a thermoplastic resin.

3. A tape carrier package according to claim 1, wherein the semiconductor chip includes intra-chip wiring and at least one bump for the intra-chip wiring.

4. A tape carrier package according to claim 1, wherein an electronic device different from said conductor chip is mounted on the inner wiring provided on the tape carrier.

5. A tape carrier package according to claim 1, wherein the anisotropic conductive resin is made of an insulating resin containing fine particles having conductivity.

* * * * *